United States Patent
Rho et al.

(10) Patent No.: US 10,295,915 B2
(45) Date of Patent: May 21, 2019

(54) MASK MANUFACTURING APPARATUS AND, MANUFACTURING METHOD OF MASK AND, MASK FOR LITHOGRAPHY

(71) Applicant: POSTECH Academy-Industry Foundation, Pohang-si, Gyeongsangbuk-do (KR)

(72) Inventors: Jun Suk Rho, Pohang-si (KR); In Ki Kim, Gimpo-si (KR); Heon Yeong Jeong, Yongin-si (KR)

(73) Assignee: POSTECH ACADEMY-INDUSTRY FOUNDATION, Pohang-si, Gyeongsangbuk-Do (KR)

( * ) Notice: Subject to any disclaimer, the term of this patent is extended or adjusted under 35 U.S.C. 154(b) by 0 days.

(21) Appl. No.: 16/049,962

(22) Filed: Jul. 31, 2018

(65) Prior Publication Data
US 2018/0348651 A1 Dec. 6, 2018

(30) Foreign Application Priority Data
May 31, 2017 (KR) ........................ 10-2017-0068029

(51) Int. Cl.
*G06F 7/20* (2006.01)
*G03F 7/20* (2006.01)
*C23C 14/04* (2006.01)
*B23K 26/362* (2014.01)
*H01L 21/308* (2006.01)
(Continued)

(52) U.S. Cl.
CPC ...... *G03F 7/70733* (2013.01); *B23K 26/0661* (2013.01); *B23K 26/18* (2013.01); *B23K 26/359* (2015.10); *B23K 26/362* (2013.01); *C23C 14/042* (2013.01); *G03F 1/0007* (2013.01); *G03F 7/70783* (2013.01);
(Continued)

(58) Field of Classification Search
CPC .. B23K 26/0661; B23K 26/18; B23K 26/359; B23K 26/362; C23C 14/042; G03F 1/0007; G03F 1/76; G03F 7/707; G03F 7/70733; G03F 7/70783; H01L 21/3086
USPC ................................... 355/67, 72, 77; 430/5
See application file for complete search history.

(56) References Cited

U.S. PATENT DOCUMENTS 5,504,793 A * 4/1996 Chen ........................ G03F 1/22
378/34
7,398,509 B2 7/2008 Schepp et al.
(Continued)

FOREIGN PATENT DOCUMENTS

| | | |
|---|---|---|
| JP | 2004502972 A | 1/2004 |
| JP | 2005519187 A | 6/2005 |

(Continued)

*Primary Examiner* — Colin W Kreutzer
(74) *Attorney, Agent, or Firm* — Dinsmore & Shohl LLP; Yongsok Choi, Esq.

(57) ABSTRACT

A mask manufacturing apparatus, a method of manufacturing the mask, and a mask for lithography, capable of providing a pattern having a size in nanometer unit using the photo-lithography process are provided. A mask manufacturing apparatus, a method of manufacturing the mask, and an elastic film for a photo-mask lower a critical dimension of the pattern(s) without increasing a manufacturing cost. The mask manufacturing apparatus and the method of manufacturing the mask, and the mask for lithography provide a pattern having a size in nanometer unit using the photo-lithography process.

20 Claims, 5 Drawing Sheets

(51) Int. Cl.
  *G03F 1/00*   (2012.01)
  *B23K 26/06*  (2014.01)
  *B23K 26/18*  (2006.01)
  *B23K 26/359* (2014.01)
  *B23K 103/00* (2006.01)

(52) U.S. Cl.
  CPC ...... *H01L 21/3086* (2013.01); *B23K 2103/42* (2018.08); *B23K 2103/50* (2018.08)

(56) References Cited

U.S. PATENT DOCUMENTS

| | | |
|---|---|---|
| 8,404,125 B2 | 3/2013 | Matsudate et al. |
| 8,459,526 B2 | 6/2013 | Hong et al. |
| 9,604,314 B2 | 3/2017 | Oh et al. |
| 2008/0038935 A1 | 2/2008 | Baude et al. |

FOREIGN PATENT DOCUMENTS

| | | |
|---|---|---|
| KR | 100298175 B1 | 5/2001 |
| KR | 1020090052203 A | 5/2009 |
| KR | 1020110013244 A | 2/2011 |
| KR | 1020150006954 A | 1/2015 |

\* cited by examiner

MASK MANUFACTURING APPARATUS AND, MANUFACTURING METHOD OF MASK AND, MASK FOR LITHOGRAPHY

CROSS-REFERENCE TO RELATED APPLICATIONS

This application claims priority to Korean Patent Application No. 10-2017-0068029 filed on May 31, 2017, the entire contents of which are herein incorporated by reference.

TECHNICAL FIELD

The present disclosure relates to a mask manufacturing apparatus, a method of manufacturing the mask, and a mask for lithography.

BACKGROUND

Processes for manufacturing semiconductor devices typically include a number of photo-lithography processes and etching processes to form a pattern (s) of a circuit element (s) on a semiconductor substrate.

In general, the photo-lithography processes use a photo-mask for forming the pattern of circuits and the like using light. As the degree of integration of semiconductor devices increases, the critical dimension (CD) of the pattern formed on the photo-mask is getting smaller.

Conventionally, quartz substrates and chromium are used as materials for the photo-mask, and the photo-lithography process is used to form a pattern having a size in micrometer unit. Meanwhile, since a pattern having a size in nanometer unit may be not formed using the photo-lithography, in order to form the pattern having the size in nanometer unit, an e-beam lithography using an electron beam should be used.

However, the e-beam lithography is costly as compared with the photo-lithography, which causes cost increase.

In the prior art, Korean Registration Patent No. 10-0298175 is published on May 29, 2001.

SUMMARY

Embodiments of the present disclosure provide a mask manufacturing apparatus, a method of manufacturing the mask, and a mask for lithography, capable of providing a pattern having a size in nanometer unit using the photo-lithography process.

Further, the present disclosure provides a mask manufacturing apparatus, a method of manufacturing the mask, and an elastic film for a photo-mask, capable of lowering a critical dimension of the pattern(s) without increasing a manufacturing cost.

According to the mask manufacturing apparatus and the method of manufacturing the mask, and the mask for lithography, it is possible to provide a pattern having a size in nanometer unit using the photo-lithography process.

Further, there is an advantage that the critical dimension of the pattern may be reduced without increasing the manufacturing cost.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Hereinafter, specific embodiments of the present disclosure will be described with reference to the drawings. However, it is merely an example, and the present disclosure is not limited thereto.

In the following description of the present disclosure, a detailed description of known functions and configurations incorporated herein will be omitted when it may make the subject matter of the present disclosure rather unclear. The following terms are defined in consideration of the functions of the present disclosure, and may be changed according to the intention or practice of the user, the operator, and the like. Therefore, the definition should be based on the contents throughout this specification.

The technical idea of the present disclosure is determined by the claims, and the following embodiments are merely a means for effectively explaining the technical idea of the present disclosure to a person having ordinary skill in the art to which the present disclosure belongs.

Figure 1:
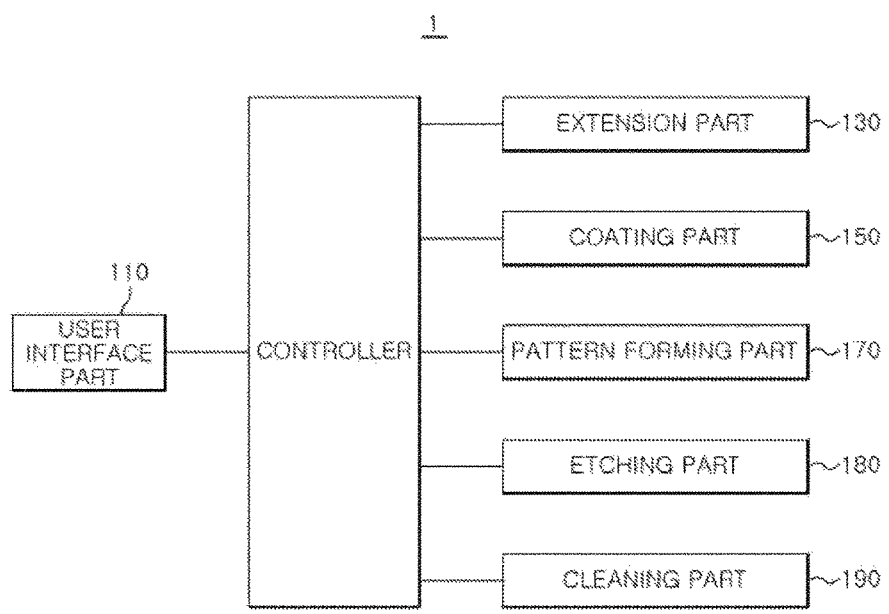
FIG. 1 is a block diagram showing a mask manufacturing apparatus according to an embodiment of the present disclosure
Figure 2:
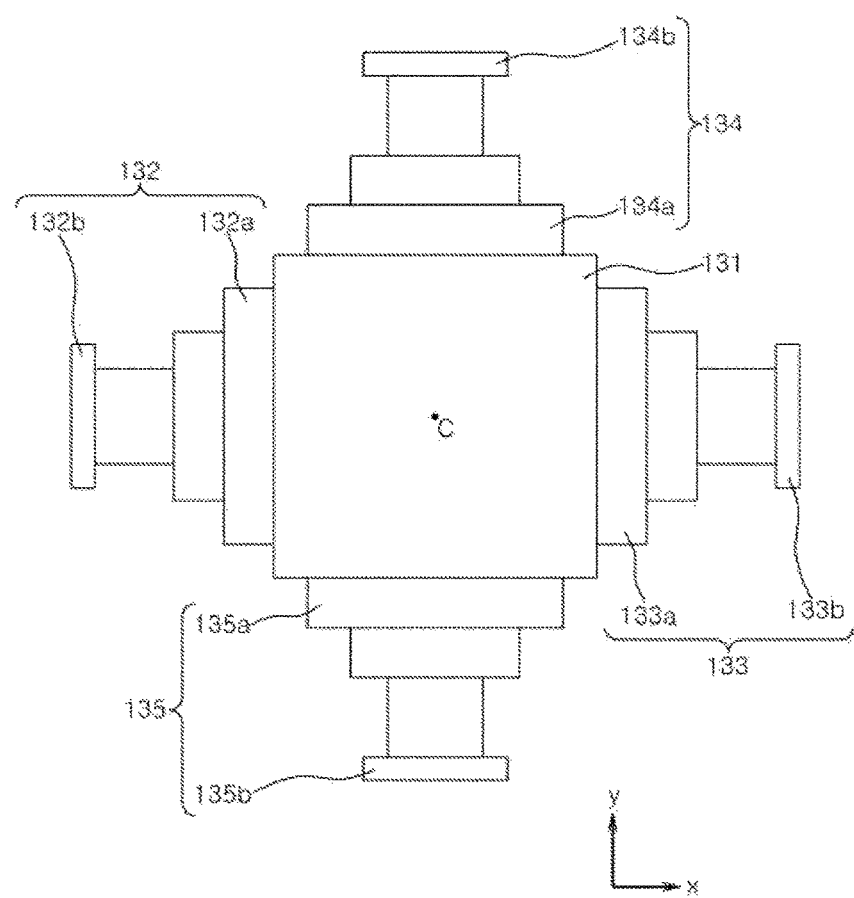
FIG. 2 is a view showing an embodiment of an extension part of FIG. 1.
Figure 3A:
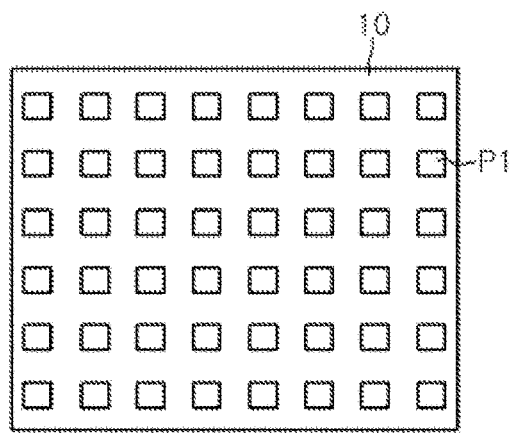
FIG. 3A is a diagram showing a mask of an extended state in which patterns are formed according to an embodiment of the present disclosure.
Figure 3B:
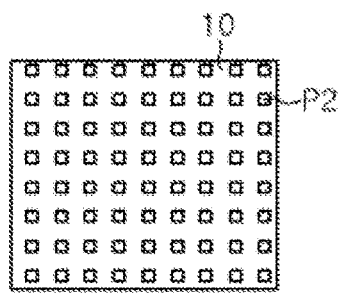
FIG. 3B is a diagram showing a mask of a restored state in which patterns are formed according to an embodiment of the present disclosure.

FIG. 1 is a block diagram showing a mask manufacturing apparatus according to an embodiment of the present disclosure, FIG. 2 is a view showing an embodiment of an extension part of FIG. 1, and FIGS. 3A and 3B are diagrams showing two masks of an extended state and a restored state in which patterns are formed according to an embodiment of the present disclosure.

Referring to FIGS. 1 to 3B, a mask manufacturing apparatus 1 according to an embodiment of the present disclosure relates to manufacturing a photo-mask by forming a pattern P on an elastic film 10 and may include a user interface part 110, an extension part 130, a coating part 150, a pattern forming part 170, an etching part 180, a cleaning part 190, and a controller 100 for controlling their components.

First, the user interface part 110 may include a PC or a smart phone or a tablet PC. The user interface part 110 may receive manufacturing information for manufacturing a mask such as any desired pattern, an extension force of an elastic film, and an extension ratio of an elastic film from the user.

The extension part 130 may be configured such that the elastic film 10 may be deformed in at least one of one axis direction, two axis directions and three axis directions. Specifically, when the elastic film 10 has a wide surface in an XY plane, the deformation in one axis direction may be understood as a deformation in an X axis direction or a Y axis direction, and the deformation in two axis directions as a deformation in the X-axis direction and the Y-axis direction. Further, the deformation in the three-axis directions may be understood as a deformation having a three-dimensional shape by deforming one point or a plurality of points of the elastic film 10 in a state deformed in the X-axis direction and the Y-axis direction.

To this end, the extension part 130 may include a plurality of moving parts for extending the elastic film 10 in one or more axis directions. In the present embodiment, the extension part 130 may be configured to extend the elastic film 10 on the X-Y plane, that is, to extend in the two-axis directions. Herein, it will describe the configuration for extending in the two-axis directions.

More specifically, the extension part 130 includes a base 131 for supporting the elastic film 10, an X-axis direction moving part for extending the elastic film 10 in the X-axis direction, and a Y-axis direction moving part for extending in the Y-axis direction. In this embodiment, the X-axis direction moving part includes first and second moving parts 132 and 133 provided on both sides in the X-axis direction of the base 131, and the Y-axis direction moving part includes third and fourth moving parts 134 and 135 provided on both sides in the Y-axis direction of the base 131.

The base 131 may be formed in a wide plate shape so that the elastic film 10 may be seated and supported and may have a space in which the moving parts 132, 133, 134 and 135 may be accommodated in the inner side or the lower side thereof. Further, a driving unit (not shown) such as a cylinder, a motor and a solenoid unit for driving the moving parts 132, 133, 134 and 135 may be installed on the base 131.

The elastic film 10 may be directly seated on the base 131 or may be seated via the substrate on the base 131. That is, the substrate may be seated and fixed on the base 131, and then the elastic film 10 may be placed on the substrate. In this case, the substrate does not extend, and only the elastic film 10 may be extended by the moving parts 132, 133, 134 and 135.

Further, although the base 131 is described as having a rectangular plane in this embodiment, but the present disclosure is not limited thereto. The base 131 may be formed in various shapes such as a circular shape, a polygonal shape and the like.

The first and second moving parts 132 and 133 may extend the elastic film 10 on the base 131 in the X-axis direction. To this end, the first moving part 132 may include a first length control part 132a which is adjustable in length, and a first clamp 132b provided on the free end side of the first length control part 132a to clamp the elastic film 10.

The first length control part 132a may have a telescopic structure, and may include a rod and the like for extension on the inside thereof. Although a telescopic device is used as the first length control part 132a in this embodiment, the concept of the present disclosure is not limited thereto, and various known configurations may be used as the first length control part 132a.

Further, the first clamp 132b may selectively clamp the end of the elastic film 10, and the elastic film 10 may be extended when the first length control part 132a is extended in one direction, for example, in the left direction of FIG. 2 after gripping the end of the elastic film 10 by the first clamp 132b. At this time, the first clamp 132b may be formed to grip only a part of one side of the elastic film 10. In this case, although the extension ratio may be varied depending on the position of the elastic film 10, the extension ratio at the central portion C or at the periphery thereof of the elastic film 10 on which the patterns are to be formed may be maintained substantially the same in the respective axial directions.

Similar to the first moving part 132, the second to fourth moving parts 133, 134 and 135 may include a second length control part 133a and a second clamp 133b, a third length control part 134a and a third clamp 134b, a fourth length control part 135a and a fourth clamp 135b, respectively, and its operations may correspond to the second moving part 133, so that detailed description is omitted.

The extension part 130 may extend the elastic film 10 in the X-axis direction and the Y-axis direction according to the control signal of the controller 100. Specifically, when the elastic film 10 is to be extended in the X-axis direction, by the first moving part 132 and the second moving part 133, the elastic film 10 may be extended by the same distance in the X-axis direction on the basis of the base 131 in a state in which both sides of the elastic film 10 are gripped in the X-axis direction, respectively. Further, when the elastic film 10 is to be extended in the Y-axis direction, by the third moving part 134 and the fourth moving part 135, the elastic film 10 may be extended by the same distance in the Y-axis direction on the basis of the base 131 in a state in which both sides of the elastic film 10 are gripped in the Y-axis direction, respectively. Thereby, the elastic film 10 can be extended by the ratio set by the user through the user interface part 110.

The extension part 130 may maintain the elastic film 10 in an extended state until patterns are is formed on the elastic film 10 and may restore the elastic film 10 from the extended state to an original state after the patterning is completed. In this case, the extension strength of the extension part 130 may be varied depending on the material and type of the elastic film 10. Further, the elastic film 10 may be extended to the same or similar to a pre-extension state by the extension part 130 when the elastic film 10 returns from the extended state to a restored state. That is, the extension strength may be corresponded to the restoring force of the elastic film 10. The elastic film 10 may be formed of a material such as polydimethylsiloxane (PDMS), polyethylene terephthalate (PET), polyamide, etc., which has excellent elasticity and restoring force. Because the elastic film 10 made of such a material has good restoring force, even if the patterns made in the extended state return to the restored state, it may be reduced at a constant rate. Further, the elastic film 10 made of a transparent material may be exposed while light in the ultraviolet (UV) region used in the lithography process is transmitted.

The coating part 150 may coats a photo-resist on an upper surface of the elastic film 10 extended by the extension part 130. The photo-resist may be made of a polymeric material whose resistance to chemicals is changed by exposure to the beam. By exposure to the beam, it may be insoluble or soluble in the drug. In the case of insolubility, the portion exposed to the beam remains and the portion not exposed to the beam may be dissolved by the developer to form the patterns P. Conversely, in the case of solubility, the portion exposed to the beam may be dissolved by the developer, and the portion not exposed to the beam remains, so that the patterns P may be formed.

The photo-resist may be provided as a material that may be coated on the elastic film 10 formed of the above-mentioned polydimethylsiloxane (PDMS), polyethylene terephthalate (PET), and polyamide. Specifically, the photo-resist may include various types depending on an ultraviolet wavelength band (i-line, g-line, DUV) of the lithography. For example, if the ultraviolet wavelength band is i-line, the photo-resist may be formed of one of SU-8, AZ 5214 and SPR-220, and if the ultraviolet wavelength band is g-line, the photo-resist may be formed of S1800. Further, if the ultraviolet wavelength band is DUV, the photo-resist may be formed of ma-N 2400 series.

The pattern forming part 170 allows the patterns P to be formed on the upper surface of the photo-resist coated on the upper surface of the elastic film 10 and may be a laser device for irradiating a beam, or a device including a mold in which patterns P is formed such as a stamp or the like. In this embodiment, it is described that the pattern forming part 170 is an optical device, capable of irradiating light, as an example. The pattern forming part 170 may be configured in such a manner that laser beams may be applied to the photo-resist, in order to be patterned on the elastic film 10 to correspond to the shape of the patterns P received through the user interface part 110 in a state in which the elastic film 10 is equally extended in the X and Y axis directions.

This pattern forming part 170 may form the pattern P having a size of 1 micrometer or a few hundred nanometers on the photo-resist coated on the upper surface of the elastic film in a state where the elastic film 10 is equally extended in the X and Y axis directions. For example, in order to repeatedly pattern a square shape within the area of the elastic film 10, the pattern forming part 170 may irradiate the beam to form a square-shaped pattern P having a size of 10-6 m in width. Thus, the portion exposed to the beam by the pattern forming part 170 may be dissolved by a developing solution to form the patterns P.

The etching part 180 allows the elastic film 10 to be etched, such that the patterns P may be formed on the elastic film 10 so as to correspond to the patterns P formed on the photo-resist. Specifically, the elastic film 10 corresponding to the dissolved portion of the photo-resist may be etched, such that the patterns P of the photo-resist coated on the elastic film 10 may be uniformly formed on the elastic film 10.

The cleaning part 190 may remove the photo-resist remaining on the upper surface of the elastic film 10 after the elastic film 10 is etched to form the patterns.

By this process, the patterns P may be formed in a state in which the elastic film 10 is extended, and the formation of the patterns P may be completed. Thereafter, the extension part 130 stops the extension of the elastic film 10, and the elastic film 10 may be restored to the original state.

After patterning in the extended state by the extension part 130, the originally restored elastic film 10 may be reduced in size of the patterns P according to the extension ratio. That is, in a case in which the elastic film 10 is extended by setting the extension ratio to N times, final patterns may be obtained by 1/N times the size of the pattern formed on the photo-resist. For example, with the elastic film 10 extended, the pattern P1 having a micrometer size in the extended state of the elastic film 10 may be reduced to a pattern P2 having a size in few nanometers in the restored state from the extended state to an original state.

That is, according to the present embodiment, the patterns having the size in nanometer unit may be obtained even with an optical beam in micrometers using the extended state and the restored state of the elastic film 10 for the photo-mask having an elastic force.

Figure 4:
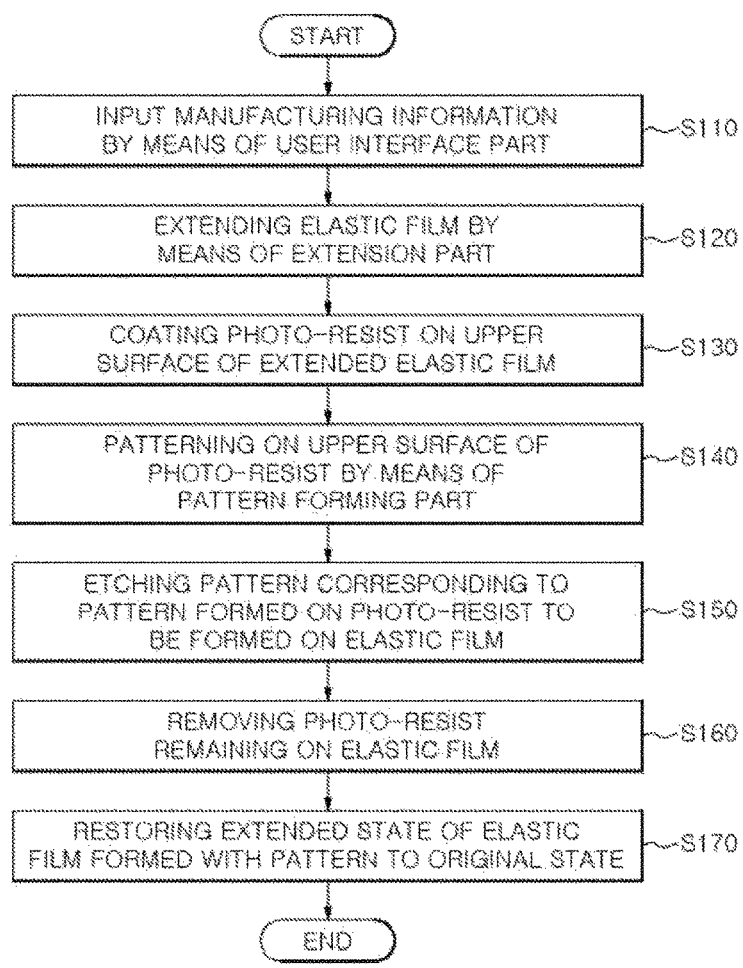
FIG. 4 is a flowchart illustrating a mask manufacturing method according to an embodiment of the present disclosure.

FIG. 4 is a flowchart illustrating a mask manufacturing method according to an embodiment of the present disclosure, and FIGS. 5A-5G are cross-sectional views of separate processes according to an embodiment of the present disclosure.

Figure 5A:
FIG. 5A is a cross-sectional view of a process according to an embodiment of the present disclosure.
Figure 5B:
FIG. 5B is a cross-sectional view of a process according to an embodiment of the present disclosure.
Figure 5C:
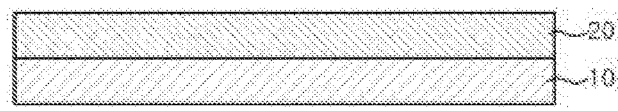
FIG. 5C is a cross-sectional view of a process according to an embodiment of the present disclosure.
Figure 5D:
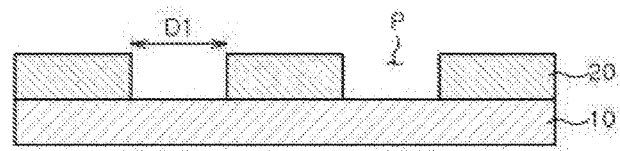
FIG. 5D is a cross-sectional view of a process according to an embodiment of the present disclosure.
Figure 5E:
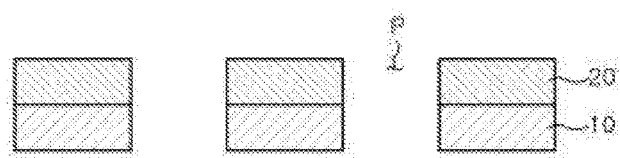
FIG. 5E is a cross-sectional view of a process according to an embodiment of the present disclosure.
Figure 5F:
FIG. 5F is a cross-sectional view of a process according to an embodiment of the present disclosure.
Figure 5G:
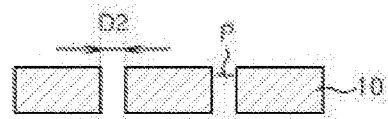
FIG. 5G is a cross-sectional view of a process according to an embodiment of the present disclosure.

Referring to FIGS. 4 and 5G, the method of manufacturing a mask according to an embodiment of the present disclosure may be initiated by the user interface part 110 receiving manufacturing information such as a desired pattern and extension strength from a user (S110). The elastic film 10 for manufacturing the mask may be mounted on the extension part 130 and the controller 100 controls the extension part 130 according to the manufacturing information to extend the elastic film 10 in the X-axis direction and the Y-axis direction (S120). The extension part 130 may extend at the same strength and the same length at the point of a contact holding the elastic film 10. As a result, the elastic film 10 may be extended from the state as shown in FIG. 5A to the state as shown in FIG. 5B. In the drawing, for the sake of convenience, although the elastic film 10 is described to be extended to about twice the level as an example, the extension ratio may vary depending on the configuration of the extension part 130 and setting values of the user interface part 110.

Further, the controller 100 may control the coating part 150 to coat the photo-resist 20 on the upper surface of the extended elastic film 10 as shown in FIG. 5C (S130). Thereafter, the controller 100 may control the pattern forming part 170 to form the pattern P on the upper surface of the photo-resist 20 by means of a patterning process as shown in FIG. 5D (S140). At this point, the pattern forming part 170 may be an apparatus using an optical beam. In this case, the manufacturing cost of the mask manufacturing apparatus as a whole may be reduced as compared with the apparatus using an electron beam.

The controller 100 controls the etching part 180 such that the elastic film 10 may be etched. Accordingly, the pattern P corresponding to the pattern P formed on the photo-resist 20 may be formed on the elastic film 10 by means of the etching part 180 (S150). As a result, the elastic film 10 on which the pattern P is formed may be obtained as shown in FIG. 5E.

Then, the controller 100 controls the cleaning part 190 to remove the photo-resist 20 remaining on the elastic film 10 as shown in FIG. 5F (S160). Also, the controller 100 controls the extension part (130) to stop the extension and to restore the extended state of the elastic film 10 to an original state as shown in FIG. 5G (S170).

In this way, the size of the elastic film (10) having a pattern formed in the extended state can be reduced while returning from the extended state to the restored state. Specifically, the size of the pattern P of the elastic film 10 formed in the etching process S150 in which the pattern P corresponding to the pattern P formed on the photo-resist 20 is formed on the elastic film 10 corresponds to the size D1 of the pattern P formed in the patterning process S140 in which the patterns are formed on the upper surface of the photo-resist 20 by means of the pattern forming part 170. However, the size of the pattern P of the finally obtained elastic film 10 becomes a smaller size D2 according to the extension ratio.

According to the prior art, in order to manufacture a mask having a very small pattern, an e-beam lithography apparatus or the like has been used, which is a very expensive equipment and a major factor in the increase of mask manufacturing cost. However, according to the present embodiment, the elastic film 10, which may be used as a mask, is extended to form patterns having a relatively large size using a relatively inexpensive photo-lithography apparatus, and then the elastic film 10 is returned from the extended state to the original state to reduce the size of the pattern, it is possible to manufacture a mask having a pattern of a relatively small size at a relatively low cost. That is, according to this embodiment, the critical dimension of the pattern may be lowered without increasing the manufacturing cost.

In other words, according to the present embodiment, it is possible to manufacture a pattern of a small size enough to be obtained through an electron beam by using a laser beam, without using an expensive electron beam or the like, in processes requiring a small pattern size.

Further, according to the present embodiment, a pattern having a size smaller than the performance of the pattern forming part 170 that determines the minimum limit of the pattern may be formed on a mask. For example, although the pattern forming part 170 having micrometer performance is used, a pattern having a size in nanometer unit may be formed.

While the present disclosure has been particularly shown and described with reference to the exemplary embodiments thereof, it is to be understood that the invention is not limited to the disclosed embodiments. Therefore, the scope of the present disclosure should not be limited to the described embodiments, and should be determined by equivalents to the appended claims as well as the following claims.

What is claimed is:

1. An apparatus for manufacturing a mask using lithography, comprising:
    an extension part for extending an elastic film in one or more axis directions;
    a coating part for coating a photo-resist on an upper surface of the elastic film extended by the extension part;
    a pattern forming part for forming patterns on the photo-resist upper surface;
    an etching part for etching the elastic film such that the same patterns as patterns formed on the photo-resist are formed on the elastic film;
    a cleaning part for removing the photo-resist remaining on the elastic film; and
    a controller for controlling the extension part after the patterns are formed on the elastic film to restore the elastic film from an extended state to an original state, wherein the controller controls an extension ratio of the elastic film to reduce the sizes of the patterns of the elastic film restored to the original state according to the extension ratio.

2. The apparatus according to claim 1, wherein the elastic film is extended in at least one of one axis direction, two axis directions and three axis directions by the extension part.

3. The apparatus according to claim 2, wherein the elastic film is extended on an X-Y plane by the extension part.

4. The apparatus according to claim 3, wherein the extension part includes:
    a base for supporting the elastic film;
    an X-axis direction moving part for extending the elastic film in an X-axis direction; and
    a Y-axis direction moving part for extending the elastic film in a Y-axis direction.

5. The apparatus according to claim 4, wherein the X-axis direction moving part includes a first moving part and a second moving part provided on both sides in the X-axis direction of the base, and
    the Y-axis direction moving part includes a third moving part and a fourth moving part provided on both sides in the Y-axis direction of the base.

6. The apparatus according to claim 5, wherein the first to fourth moving parts include:
    a length control part allowed to be adjustable in length; and
    a clamp provided on a free end side of the length control part to clamp the elastic film, respectively.

7. The apparatus according to claim 4, wherein in a state where a non-extended substrate is placed on the base and the elastic film is seated on the substrate, the elastic film is extended by the X-axis direction moving part and the Y-axis direction moving part.

8. The apparatus according to claim 1, further comprising:
    a user interface part for receiving manufacturing information including a desired pattern and extension strength from the user.

9. The apparatus according to claim 8, wherein the pattern forming part forms the pattern into the elastic film according to the information delivered by the user interface part in a state where the elastic film is extended by the extension part.

10. The apparatus according to claim 1, wherein the pattern forming part is a laser device for irradiating a laser beam or a patterned mold.

11. The apparatus according to claim 9, wherein the pattern forming part includes an optical device for forming patterns having a size from 1 nanometer to 1000 nanometers, and
    the patterns having the size from 1 nanometer to 1000 nanometers are formed on the photo-resist by the pattern forming part.

12. The apparatus according to claim 1, wherein the elastic film is formed of a material having elasticity and resilience including at least one of polydimethylsiloxane (PDMS), polyethylene terephthalate (PET), and polyamide.

13. A method of manufacturing a mask using a lithography process, comprising:
    extending an elastic film by an extension part according to an extension ratio controlled by a controller;
    coating a photo-resist on an upper surface of the elastic film by a coating part in a state where the elastic film is extended by the extension part;
    forming patterns on an upper surface of the photo-resist by a pattern forming part;
    etching the elastic film by etching part such that the same patterns as patterns formed on the photo-resist are formed on the elastic film;
    removing the photo-resist remaining on the elastic film by a cleaning part; and
    restoring the elastic film patterned in an extended state from the extended state to an original state to reduce the sizes of the patterns of the elastic film restored to the original state according to the extension ratio.

14. The method according to claim 13, wherein the extension part includes a plurality of moving parts for extending the elastic film in any one of a plurality of axial directions, and
    each of the moving parts includes a length control part allowed to be adjustable in length; and a clamp provided on a free end side of the length control part to clamp the elastic film, respectively.

15. The method according to claim 14, wherein the extension part includes a base for supporting the elastic film; and the elastic film is extended based on the center of the base by the length control part.

16. The method according to claim 14, wherein the extension part includes first and second moving parts for extending the elastic film in an X-axis direction and third and fourth moving parts for extending the elastic film in a Y-axis direction.

17. The method according to claim 13, wherein the elastic film is formed of a material having elasticity and resilience including at least one of polydimethylsiloxane (PDMS), polyethylene terephthalate (PET), and polyamide.

18. A mask for a lithography produced by the apparatus according to claim 1.

19. A mask for a lithography produced by the method according to claim 13.

20. The mask according to claim 19, wherein the elastic film is formed of a polyamide material.

* * * * *